(12) United States Patent
Lewis et al.

(10) Patent No.: US 9,720,650 B2
(45) Date of Patent: Aug. 1, 2017

(54) METHOD FOR POST-PROCESSING AN OUTPUT OF A RANDOM SOURCE OF A RANDOM GENERATOR

(71) Applicant: Robert Bosch GmbH, Stuttgart (DE)

(72) Inventors: Matthew Lewis, Reutlingen (DE); Eberhard Boehl, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 264 days.

(21) Appl. No.: 14/324,668

(22) Filed: Jul. 7, 2014

(65) Prior Publication Data

US 2015/0019602 A1    Jan. 15, 2015

(30) Foreign Application Priority Data

Jul. 9, 2013   (DE) .................... 10 2013 213 396

(51) Int. Cl.
  *G06F 7/58*   (2006.01)
  *H03M 7/30*   (2006.01)
  *H03M 5/14*   (2006.01)
  *H03M 7/14*   (2006.01)

(52) U.S. Cl.
  CPC ............ *G06F 7/588* (2013.01); *H03M 5/145* (2013.01); *H03M 7/14* (2013.01); *H03M 7/30* (2013.01); *H03M 7/6011* (2013.01)

(58) Field of Classification Search
  CPC .................................. G06F 7/58; G06F 7/588
  See application file for complete search history.

(56) References Cited

U.S. PATENT DOCUMENTS

| 4,799,259 | A | * | 1/1989 | Ogrodski | H03K 3/84 331/78 |
|---|---|---|---|---|---|
| 5,434,806 | A | * | 7/1995 | Hofverberg | G06F 7/584 708/253 |
| 5,963,104 | A | * | 10/1999 | Buer | G06F 7/588 331/78 |
| 2003/0097387 | A1 | * | 5/2003 | Shackleford | G06F 7/582 708/250 |
| 2009/0077146 | A1 | * | 3/2009 | Hars | G06F 7/58 708/251 |
| 2012/0221616 | A1 | * | 8/2012 | Yasuda | H03K 3/84 708/251 |
| 2014/0143292 | A1 | * | 5/2014 | Yasuda | G06F 7/588 708/251 |

FOREIGN PATENT DOCUMENTS

| DE | 602004011081 | 1/2009 |
|---|---|---|
| EP | 1686458 | 8/2006 |

OTHER PUBLICATIONS

VidyarthiPlus, Digital Logic Circuits—Half and Full Subtractor, May 14, 2012, pp. 1-7.*

* cited by examiner

*Primary Examiner* — Andrew Caldwell
*Assistant Examiner* — Calvin M Brien
(74) *Attorney, Agent, or Firm* — Norton Rose Fulbright US LLP; Gerard Messina

(57) ABSTRACT

A method and an assemblage for post-processing an output of a random source of a random generator are presented. In the method, an output signal of the random source is compressed, thereby yielding a sequence of compressed signal values that are checked in terms of their distribution.

10 Claims, 3 Drawing Sheets

METHOD FOR POST-PROCESSING AN OUTPUT OF A RANDOM SOURCE OF A RANDOM GENERATOR

FIELD OF THE INVENTION

The present invention relates to a method for post-processing an output of a random source of a random generator, and to an assemblage for carrying out the method.

BACKGROUND INFORMATION

Random numbers, as results or outputs of random sources in random generators, are required for many applications. Random generators are methods that supply a sequence of random numbers. A critical criterion for the quality of random numbers is whether the result of the generating process can be regarded as independent of previous results.

Random numbers are required, for example, for cryptographic methods, being used to generate keys for these encoding methods. For example, random number generators (RNGs) are used to generate master keys for symmetrical encoding methods and protocol handshaking in elliptical curve cryptography (ECC), which prevent a power analysis attack and replay attacks.

There are two basic types of random generators, firstly pseudo-random number generators (PRNGs) for high throughputs and low security levels. In a PRNG usually a secret value is inputted, and each input value will always produce the same output series. A good PRNG, however, will output a series of numbers that appears random and that will withstand most tests.

It is noteworthy that high standards in terms of random properties are applied to keys for cryptographic methods. Pseudo-random number generators (PRNGs), represented e.g. by a linear feedback shift register (LRFS), are therefore not suitable for this purpose. Only a generator of truly random numbers, referred to as a true random number generator (TRNG), meets the relevant requirements. This represents the other type of random generator. In this, natural noise processes are used in order to obtain an unpredictable result.

Noise generators that utilize the thermal noise of resistors or semiconductors, or the shot noise at potential barriers or at p-n transitions, are usual. A further possibility is to utilize the radioactive decay of isotopes.

While the "classic" methods used analog elements, for example resistors, as noise sources, in the recent past digital elements, for example inverters, have been used. These have the advantage of less complexity in terms of circuit layout, since they exist as standard elements. In addition, such circuits can also be used in user-programmable circuits such as FPGAs.

It is known, for example, to use ring oscillators that represent an electronic oscillator circuit. With these, an odd number of inverters is interconnected to form a ring, so that an oscillation having a natural frequency is produced. The natural frequency depends on the number of inverters in the ring, the properties of the inverters, the interconnection conditions (i.e. lead capacitances), operating voltage, and temperature. The noise of the inverters causes a random phase shift to be produced with respect to the ideal oscillator frequency, which is used as a random process for the TRNG. It is noteworthy that ring oscillators oscillate independently and do not require external components such as capacitors or coils.

The output of the ring oscillators can be compressed or subjected to post-processing in order to compress or bundle (i.e. increase) entropy and eliminate any bias.

A problem in this connection is that the ring oscillator must be sampled as close as possible to an expected ideal edge so that a random sampled value is obtained. The publication of Bock, H., Bucci, M., Luzzi, R.: An Offset-Compensated Oscillator-Based Random Bit Source for Security Applications, CHES 2005, indicates how it is possible, by controlled shifting of the sampling point in time, always to sample in the vicinity of an oscillator edge.

European Patent No. 1 686 458 discloses a method for generating random numbers with the aid of a ring oscillator, in which a first and a second signal are made available, the first signal being sampled in a manner triggered by the second signal. In the method described, a ring oscillator is repeatedly sampled, in which context only non-inverting delays, i.e. an even number of inverters as delay elements, are always used. The oscillator ring is always sampled, simultaneously or with a mutual delay, after an even number of inverters beginning from a starting point. Shifting of the sampling point in time can thereby be omitted; instead, the multiple sampled signals are evaluated.

The publication "Design of Testable Random Bit Generators" by Bucci, M. and Luzzi, R. (CHES 2005) presents a method with which an influence on the random source can be identified. Attacks can thereby be prevented. A direct distinction between random values and deterministic values is, however, not possible therewith. It is possible to evaluate the quality of the random source by counting the transitions.

A further possibility is provided by the use of multiple ring oscillators. This is presented, for example, in the publication Sunar, B. et al.: A Provable Secure True Random Number Generator with Built In Tolerance Attacks, IEEE Trans. on Computers, January 2007. Here sampled values of several ring oscillators are combined with one another and evaluated.

As already stated, in ring oscillators an odd number of inverters is interconnected to form a ring, thereby producing an oscillation having a natural frequency. The natural frequency depends on the number of inverters in the ring, the properties of the inverters, the interconnection conditions (i.e. lead capacitances), operating voltage, and temperature. The noise of the inverters produces a random phase shift with respect to the ideal oscillator frequency, which is utilized as a random process for the TRNG.

An advantageous implementation of a TRNG source using a ring oscillator sampled at multiple points is shown in FIG. 1. This circuit at the same time offers the advantage that a correlation with the system clock can be identified, and faults can be discovered, when particular implementation conditions are present with a uniform capacitive load at all nodes of the ring oscillator, and when the circuit elements used (e.g. flip-flops, inverters) are configured in terms of design so that they react as homogeneously as possible to leading and trailing edges.

The publication "Design of Testable Random Bit Generators" by Bucci, M. and Luzzi, R. (CHES 2005) presents a method with which an influence on the random source can be identified. Attacks can thereby be prevented. A direct distinction between random values and deterministic values is, however, not possible therewith.

German Patent No. 60 2004 011 081 describes a possibility for testing a TRNG source after "post-processing," as well as the manner in which this post-processing is shifted into a certification mode.

SUMMARY

In light of the above, a method and an assemblage are presented.

In the case of the method presented, in an embodiment provision can be made either that the bits of the output signal are directly combined with one another by way of a linear operation, and that that combined signal is serially compressed using a linear operation, or that firstly compression occurs bitwise, and the compressed values are then subjected to a further treatment, for example are combined linearly. A first post-processing step and a second post-processing step can be provided, a linear operation, e.g. with an XOR element or an XNOR element, being performed in at least one of the two.

All methods hitherto having exclusively digital elements as an entropy source, for example an odd number of inverters connected into a ring, require in some cases very complicated post-processing circuits that on the one hand enrich entropy, and on the other hand ensure a uniform distribution of random bits between the values 0 and 1. The method presented offers a simple capability for post-processing. In particular, the complex post-processing with a certification mode described in the document German Patent No. 60 2004 011 081 can be omitted.

In accordance with the method presented, a TRNG source having multiple outputs can be used, each of said outputs being equipped with a simple compression function, e.g. a serial XOR. The complexity of such a method is sufficiently low that a TRNG can be realized using approximately 200 gate equivalents. This is appreciably more favorable than with known methods.

Blockwise linear combination can be achieved, for example, using a serial XOR, the output signal being, for example, linearly combined by XOR using an intermediate signal. XNOR combination is likewise possible. The result of this combination is stored in a memory element, for example a flip-flop. The output signal of this memory element is the intermediate signal. The compressed signal thereby formed in the memory element is read out after a predefined number n of clock cycles. The memory element is then reset. The number n should be odd if at all possible, since n zeros and n ones then yield different results.

The distribution can be checked, for example, by counting the occurrence of bit value 0 and bit value 1 in separate counters for m compressed output bits, and carrying out the comparison by taking the difference between these counter values and by comparing the difference with a predefined bound.

The frequency of the ring oscillator can be influenced by the selection of the number of inverting elements or also by modifying the operating conditions, for example operating voltage, temperature, etc. The number of inverting elements in the ring oscillator can be modified as follows:
a) Generic approach for synthesis with a variable number of inverting elements. This can be performed, however, only in a FPGA after re-synthesis.
b) Equip the structure of the ring oscillator with inverting elements that in part can be bypassed, under the control of a control signal. This additional circuit amplifies the unequal capacitances of the nodes in the ring oscillator. This does not have a disadvantageous effect, however, if the compression factor and/or sampling frequency is/are correspondingly varied.

Modifications to the operating conditions can be performed as follows:

a) by way of a separately controllable supply voltage that is explicitly fed out, or by way of series resistors in the power supply to the ring oscillator (voltage drop),
b) using heating or cooling elements that are selectably switched in.

A mutual comparison means, for example, that the largest and the smallest number of an assignment are identified by a larger/smaller comparison, for example
a) by checking whether a difference becomes negative, or
b) by sorting the assignment values, namely a bitwise decision beginning from the MSB; at the first deviation at a bit position, the value having a 1 at that location is larger than the other,
and then calculating the difference between the largest and smallest value, which is in turn compared with a fixed bound.

Further advantages and embodiments of the invention are apparent from the description and the appended drawings.

It is understood that the features recited above and those yet to be explained below are usable not only in the respective combination indicated, but also in other combinations or in isolation, without departing from the scope of the present invention.

DETAILED DESCRIPTION

Figure 1:
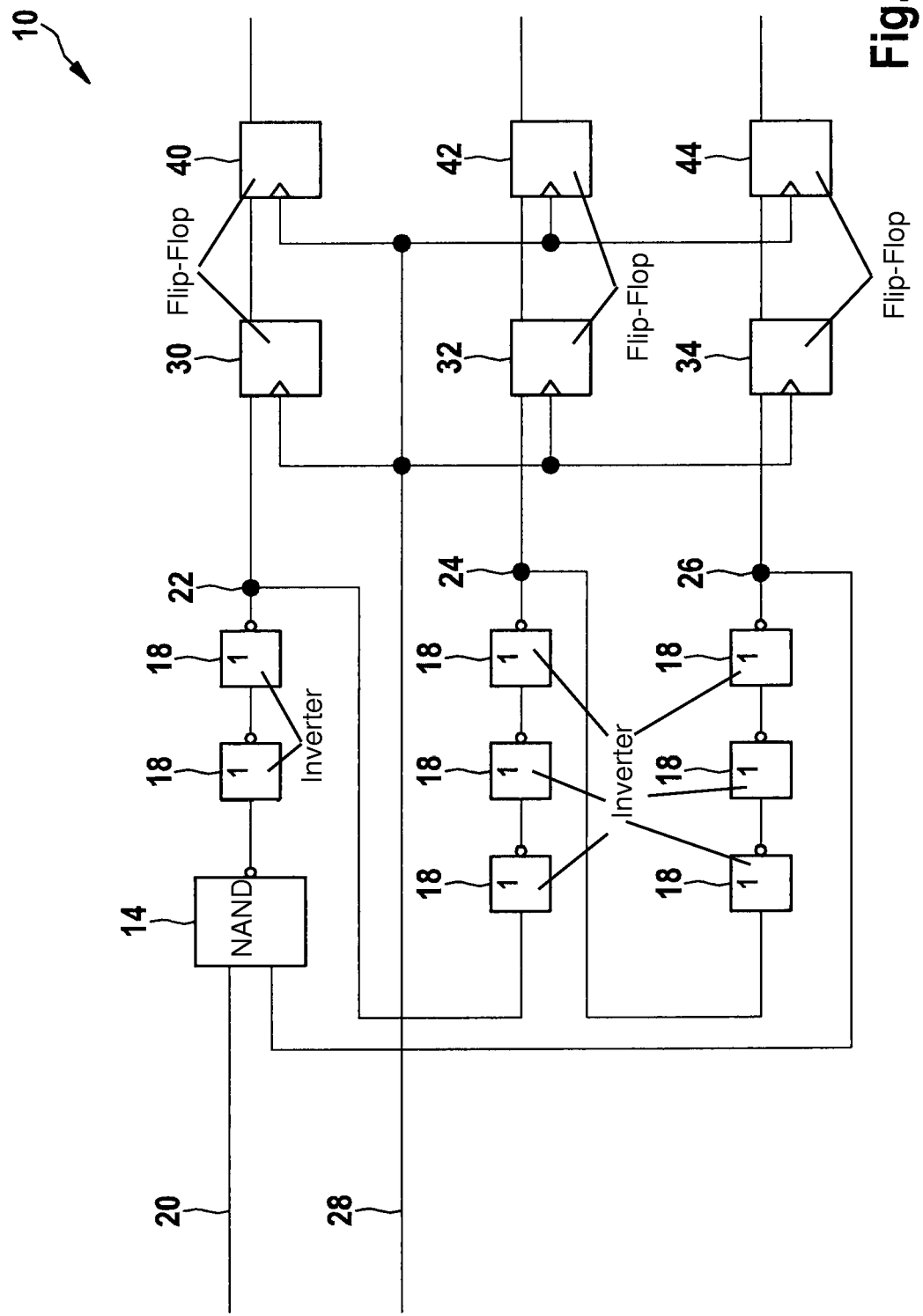
FIG. 1 shows an embodiment of a ring oscillator.

The invention is schematically depicted in the drawings on the basis of embodiments, and will be described in detail below with reference to the drawings.

FIG. 1 shows an embodiment of a ring oscillator as a random source, labeled in its entirety with the reference number 10. Ring oscillator 10 has a NAND element 14 and eight inverters 18, and thus nine inverting elements. Ring oscillator 10 thus has an odd number of inverting elements and three pickoffs or sampling points.

Ring oscillator 10 can be started and stopped with a first input 20. The sampling rate is defined via a second input 28. The depiction furthermore shows a first sampling point 22, a second sampling point 24, and a third sampling point 26. This means that beginning from first sampling point 22, a sampling action always occurs after an odd number of inverting elements. This is not absolutely necessary, however, for the method presented.

First sampling point 22 is sampled using a first flip-flop 30, yielding the sampled value s10. Second sampling point 24 is sampled using a second flip-flop 32, yielding the sampled value s11. Third sampling point 26 is sampled using a third flip-flop 34, yielding the sampled value s12. First flip-flop 30 has a further, fourth flip-flop 40 associated with it. This performs a memory function, and outputs the value s10' that follows the value s10 in time, i.e. s10 and s10' are chronologically successive sampled values of first sampling point 22. Correspondingly, second flip-flop 32 has associated with it a fifth flip-flop 42 that outputs s11', and third flip-flop 34 has associated with it a sixth flip-flop 44 that outputs s12'. Flip-flops 40, 42, and 44 are suitable for resolving metastable states of flip-flops 30, 32, and 34. Metastable states arise from the fact that a switchover of the signal at input 28 occurs during an edge at the respective sampling point 22, 24, 26. Flip-flops 30, 32, and 34 then require a certain time until a stable final state is reached. In the present example, that time is guaranteed by the fact that it is not until the next active edge of the signal at input 28 that the now-stable value of flip-flops 30, 32, and 34 is transferred into flip-flops 40, 42, and 44. Flip-flops 30, 32, 34, 40, 42, and 44 serve as memory elements in accordance with claim 1.

Ring oscillator 10 can thus in principle be constructed from, for example, nine inverters 18. One of these inverters 18 can be replaced by NAND element 14 in order to allow ring oscillator 10 to be stopped. Alternatively, this NAND element 14 can also be replaced by a NOR element.

In the embodiment shown, the values of ring oscillator 10 are stored simultaneously, each in one flip-flop (FF) 30, 32, 34, at three different inverters. These pickoffs are intended to be distributed as regularly as possible over the elements of ring oscillator 10. For the case of nine inverting stages in ring oscillator 10, a pickoff or a sampling point 22, 24, 26 is therefore provided after each three inverting elements. As already mentioned, however, this is not necessary for the method presented. It is also possible to provide a pickoff again after an even number of inverting elements.

The number of inverter stages in ring oscillator 10 determines the frequency of the oscillator, and should therefore be selected so that the flip-flops can store the respective signal value. If an oscillator frequency that is as high as possible is used, the probability of being in the vicinity of an edge when sampling is higher. The number of inverters in the oscillator ring is therefore selected to be as small as possible, but still large enough that the flip-flops are functional for the frequency attained. For a 180-nm technology, a frequency of approximately 1 GHz for ring oscillator 102 having nine inverters 18 was determined by simulation. The flip-flops can store the signal values at this frequency, as has been demonstrated.

The method presented can be carried out with ring oscillator 10 according to FIG. 1 that has an odd number of inverting elements, values being picked off at at least one sampling point of the ring oscillator.

A correlation with the system clock and thus with the sampling clock cycle obtained therefrom can be identified for ring oscillator 10. For this, a comparison is made as to whether the three bit values at the output of flip-flops 30, 32, and 34 are identical to those at the output of flip-flops 40, 42, and 44. Not all correlations can be identified here by comparing s10, s11, s12 to s10', s11', s12', even if the divisor value of the frequency divider is divisible by the number of inverting elements in the oscillator ring. It can happen that after a respective arbitrary (optionally constant) number of sampling actions, sampling keeps occurring at the same position in the oscillator cycle. If that number is not simultaneously a divisor of the number of inverting elements in the oscillator, the comparison described above does not yield any information as to the correlation that exists. It is nevertheless possible to identify the correlation when all the samples are compared with the current sample. This is, however, very laborious.

For the ring oscillator in accordance with FIG. 1 having, for example, nine inverters and three sampling points, the bit values stored at the sampling points generally change by at least one bit value after not too large a number of samples. A large number of successive identical bit values is detected by counting warnings, and either a fault is signaled or an influence is exerted on the frequency of the oscillator.

For the ring oscillator according to FIG. 1, nine inverters and three sampling points are provided. In a first flip-flop that is connected to one sampling point of the oscillator, the states of the oscillator at the sampling point are stored. The second row of successive flip-flops is suitable for compensating for metastable states in the respective first flip-flops. Metastable states of this kind can arise from the fact that the sampling clock rate becomes active precisely during a state transition of the oscillator. Storing the state again in the respective second flip-flop ensures that the state of the first flip-flop can settle, over one period of the sampling clock rate, before that stable value is transferred into the second flip-flop. If this structure is realized in balanced fashion, a desired behavior can be achieved. This balancing requires the use of special gates, however, namely inverters and flip-flops, that possess sufficiently identical driver strength for the low-high and high-low edge, including for the internal nodes of the flip-flops. In addition, the layout must be constructed so that identical load capacitances exist for all pickoffs of the ring oscillators and their controlling nodes. For a balanced circuit according to FIG. 1, for example, the bit assignments 000 and 111 do not occur.

In a test chip in this case, gates of a standard digital library were used. The ring oscillator can additionally have one more pickoff to which an amplifier is connected for frequency measurement purposes. In the context of measurements on this test chip, it was possible to ascertain that the predicted distribution of the output bits is not correct. The values 000 and 111 do both occur. It was additionally ascertained that the distribution of the remaining six states does not occur in equally distributed fashion even when the sampling frequencies are varied. It was found in particular that in the test chip in question, the number of sampled values having decimal values 3, 5, and 6 of the three sampled bits is appreciably higher than that of 1, 2, and 4.

It was found that when a post-processing is performed in which the three output bits are XORed with one another, a 0 occurs as a result much more often than a 1. This bias in the zero-to-one distribution should in fact be avoided, or at least corrected by suitable post-processing. The sequence of random bits thereby obtained is also referred to as an "internal random sequence," which should exhibit an equal distribution of 0 and 1 (see: Killmann, W., Schindler, W.: AIS 31, Version 1, BSI of Sep. 25, 2001). If a distribution of this kind of the internal random sequences is not possible, a complex structure that generates random numbers from the internal random sequences is also permissible as post-processing. Because such structures possibly effect a distortion that simply conceals the true (i.e. insufficient) behavior, particular testability is required even after post-processing if the test of the internal random sequences was not successful. This certification mode necessary for this purpose is described, for example, in the document DE 60 2004 011 081 T2. If such a test is passed, the post-processing structure is then therefore regarded as suitable, and the tests with regard to equal distribution of 0 and 1 can also be demonstrated on the output data of said complex post-processing structure.

The result of the method described is to eliminate such a structure, and in particular the certification mode. This is possible if the internal random sequences already exhibit the required properties. For this, for example, a simple compression is already performed bitwise before the individual bits are further processed. The circuit of FIG. 2 proposes a compression, using a respective serial XOR, before the value is stored in the second flip-flop.

Figure 2:
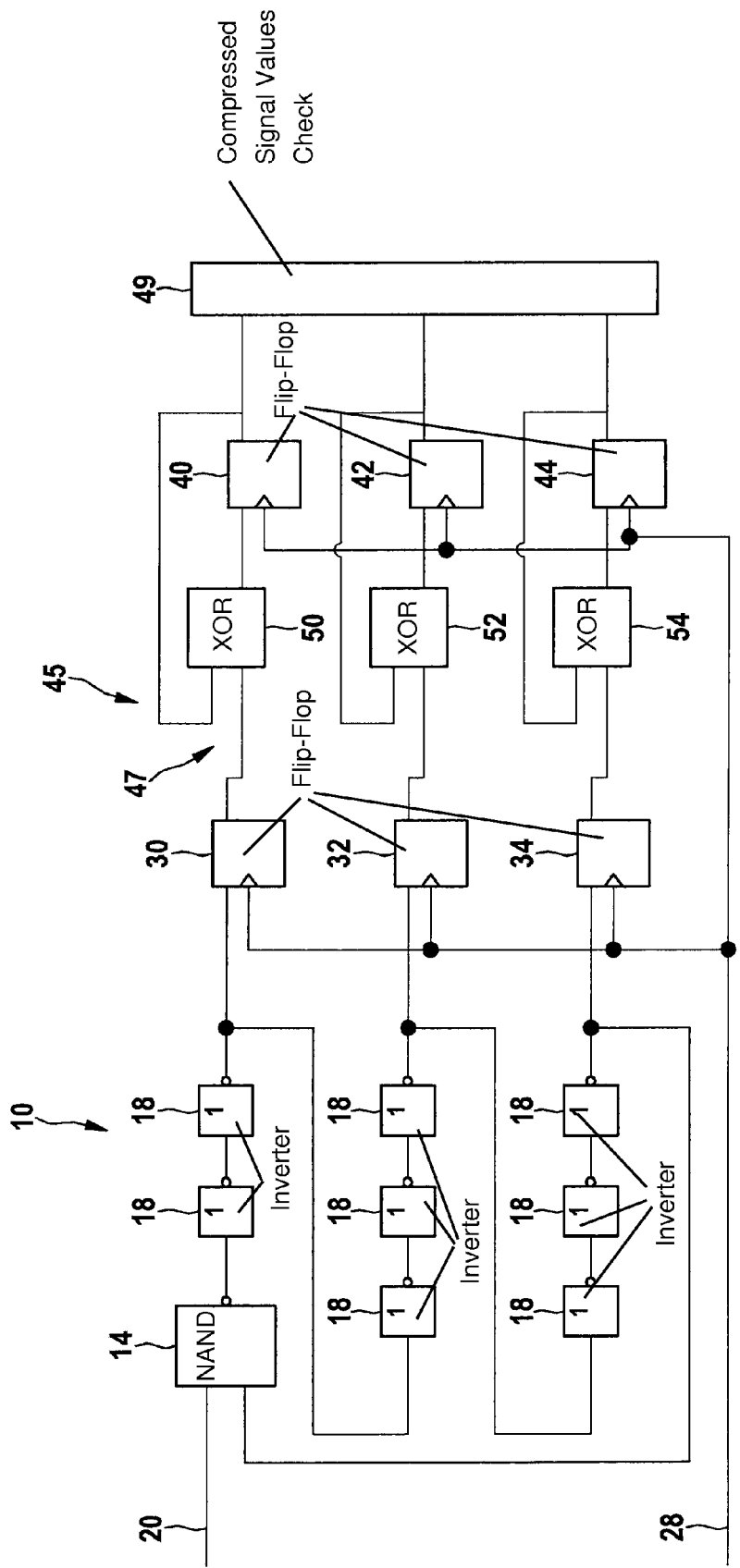
FIG. 2 shows an embodiment of the assemblage together with the ring oscillator of FIG. 1.

FIG. 2 shows an assemblage 45 having ring oscillator 10 of FIG. 1, a first XOR element 50, a second XOR element 52, and a third XOR element 54 being provided. With these, a bitwise compression is performed. They thus constitute a circuit 47 for compression. The compressed values are inputted into second flip-flops 40, 42, and 44. The outputs thereof are labeled s10", s11", and s12" (s1i"). Flip-flops 30, 32, and 34 serve as memory elements whose outputs s10, s11, and s12 are post-processed.

Once the sampled values of ring oscillator 10 have each been stored in one of first flip-flops 30, 32, and 34, each individual bit s1i is, in a second step, XORed with the respective output of one of second flip-flops 40, 42, and 44. A compression is thereby achieved by allowing the value of s1i to enter, for example, n times into the value of s1i".

Second flip-flop 40, 42, and 44 at the same time also performs the task of taking into account metastable states in the respective first flip-flop 30, 32, and 34, by the fact that an entire sampling period is available for that labile state to settle. The degree of compression n should be selected to be sufficient that the prescribed zero-to-one distribution is achieved for each individual bit. Further processing of the bits can be accomplished using additional post-processing structures that do without a certification mode. For this, the three bits can be antivalently combined with one another, for example XORed, or can also be incorporated in parallel fashion into a post-processing structure. It is advantageous if the compression factor n is, if at all possible, odd. The result is that n successive zeros yield a different bit value (0) than n successive ones (1). It could furthermore be useful if n is a prime number, since the compression then cannot be assembled from a sum of multiple compressions.

The bitwise serial XOR operation on the one hand achieves the objective of eliminating unequal zero-to-one distributions, and on the other hand entropy (the random value) is enriched by the compression.

The improved distribution of 0 and 1 is determined by the magnitude of the compression factor n. A larger n as a rule yields a more equal distribution.

At the same time, consideration must be given to how much entropy the sampled values contain. The amount of jitter present at the sampling point in time plays a role here. The jitter can be calculated as $$\sigma_{\Delta T} = \sqrt{\frac{8}{3\eta}} \sqrt{\frac{V_{DD}}{V_{Char}} \frac{k_B T}{P}} \sqrt{\Delta T} \quad (1)$$

in which, for short-channel transistors, $$V_{Char} = \frac{3}{8}\left(\frac{V_{DD}}{2} - V_T\right), \quad (2)$$

wherein furthermore
$k_B$=Boltzmann constant ($1.38 \cdot 10^{-23}$ J/K)
$\eta$=technology constant of the switching elements used (typically $\approx 1$)
$V_{DD}$=operating voltage of the oscillator (e.g. 1.8 V)
T=temperature (e.g. 298 K)
P=power consumption of the oscillator
$V_T$=threshold voltage of the transistors in the oscillator
$\Delta T$=time span between two sampling actions
$\sigma_{\Delta T}$=standard deviation of the jitter.

In order to calculate the entropy, it is assumed that in a region of $\pm 1.299\, \sigma_{\Delta T}$ around an oscillator edge, the entropy value is 0.5, and outside that region the value is assumed to be 0. If it is then assumed that the samples are uniformly distributed over the oscillator period if the oscillator frequency and sampling frequency are not oscillating with one another, one then obtains an entropy value in accordance with the proportion of the region of $\pm 1.299\, \sigma_{\Delta T}$ and the corresponding number of edges to be taken into account in proportion to the oscillator period. For a doubling of the sampling period this entropy value will assume a value $\sqrt{2}=1.414$ times greater, since the jitter increases by a factor of 1.414 according to the equation above. There is only one sampled value in the same time period, however, while prior to the doubling the sampling period had two sampled values.

If the entropy for a single sampling period is equal to x, it is then 2*x for two samples. A doubling of the sampling period, however, yields a value of only 1.414*x for the entropy in the same time period.

It is therefore more favorable to select the sampling period not to be too long, and conversely to compress more sampled values, i.e. an n as high as possible. On the other hand, however, it can also be unfavorable to compress too many sampled values with the XOR according to FIG. 2, since entropy values can then compensate for one another. It is noteworthy that an even number of entropy values of "1" cancel each other out in the context of XOR compression. Experimental investigations have shown that a compromise for the sampled values can exist for n between a few tens and a few hundreds to a few thousands. In this case the sampling frequencies were between 300 kHz and 12.5 MHz at an oscillator frequency of close to 1 GHz. The internal random sequences thereby obtained already passed the generally acknowledged statistical tests without utilizing additional post-processing.

It can therefore be claimed that a ring oscillator is constructed from standard digital elements, namely inverters or inverting elements and a NAND or NOR to stop the oscillator. It can also be claimed that the digital standard design flow can be used for the design of the ring oscillator and for the sampling flip-flops, since no manual intervention in the layout is required. In the test chip in this case, not only were the digital elements very asymmetrical in terms of their driver effect with regard to the edges, but the capacitive load on the ring oscillator was also very differently distributed as a result of the connection of an amplifier for frequency measurement. All of this no longer had a disadvantageous influence on the statistical tests after XOR compression in a context of suitable parameters. The conditions of the tests can be met without additional complex structures for post-processing. For this, the three compressed signals can be XORed with one another (antivalence) or operating on using another linear function, e.g. equivalence, and this output signal is further processed.

In a further embodiment, the output bits of the three sampling flip-flops can also be linearly combined with one another even before XOR compression, for example using XORs (antivalence) or also equivalence operators (XNOR).

A device 49 for checking the compressed signal values in terms of their distribution is furthermore provided. The aforementioned XORing of the three compressed bits can also, for example, occur in this device 49, an output bit of the random generator being generated in each case.

Figure 3:
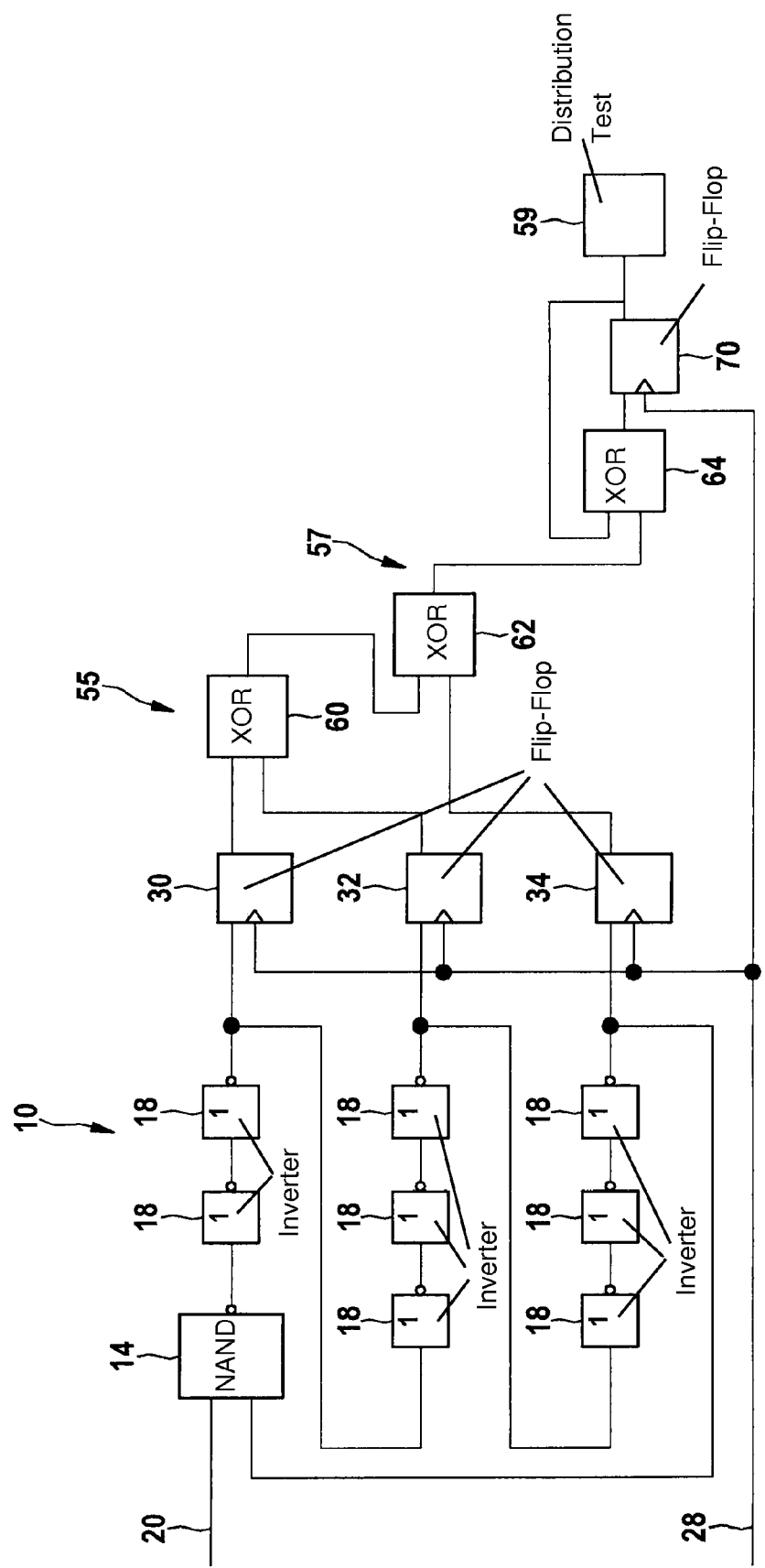
FIG. 3 shows a further embodiment of the assemblage.

FIG. 3 shows a random generator 55 as a possible embodiment of the assemblage presented, having ring oscillator 10 and having a first XOR element 60 with output s01, a second XOR element 62 with output s012, and a third XOR element 64. Also provided is a second flip-flop 70 that outputs s012". XOR elements 60, 62, and 64 constitute a circuit 57 for compression. A device 59 for testing a distribution is also depicted.

The advantage of this embodiment is that only one signal now needs to be serially compressed by XOR. To be noted, however, is the fact that the properties of the circuit can no longer be evaluated as effectively as when the three compressed signals are preset. Because of the linearity of the XOR operations, the output signals of FIG. 2 and FIG. 3 are identical when the three output signals of FIG. 2—s10", s11", and s12"—are XORed to yield one signal s012":

$$s012''=s10'' \oplus s11'' \oplus s12''.$$

Assuming $$s10''=s10(0) \oplus s10(1) \oplus s10(2) \ldots \oplus s10(n-1)$$

$$s11''=s11(0) \oplus s11(1) \oplus s11(2) \ldots \oplus s11(n-1)$$

$$s12''=s12(0) \oplus s12(1) \oplus s12(2) \ldots \oplus s12(n-1),$$

the equation above becomes $$s012''=s10(0) \oplus s10(1) \ldots \oplus s10(n-1) \oplus s11(0) \oplus s11(1) \ldots \oplus s11(n-1) \oplus s12(0) \oplus s12(1) \ldots \oplus s12(n-1),$$

and according to FIG. 3:

$$s012=s10 \oplus s11 \oplus s12$$

and $$s012''=s012(0) \oplus s012(1) \oplus s012(2) \ldots \oplus s012(n-1)$$

the equation above becomes $$s012''=s10(0) \oplus s11(0) \oplus s12(0) \oplus s10(1) \oplus s11(1) \oplus s12(1) \ldots s10(n-1) \oplus s11(n-1) \oplus s12(n-1).$$

Because of the commutative antivalence law, according to which the operands can be arbitrarily interchanged, the two equations for s012" are identical.

A TRNG can be realized as intellectual property (IP) with the method presented. A product is referred to as IP when it provides a circuit description, together with tests, in such a way that a customer of said product is capable of realizing the circuit on a chip with the customer's own technology. Because of the extraordinarily low complexity in terms of circuit engineering, namely approximately 200 gate equivalents, it is usable practically everywhere randomness plays a role.

The invention can moreover be employed in sensor evaluation systems for manipulation protection or in security applications where such TRNGs are connected to the Internet.

Also presented is a circuit assemblage having at least one ring oscillator that encompasses a ring-shaped interconnection of an odd number of inverting elements, said ring oscillator being sampled at one or more sampling points or positions, the sampled values being stored in memory elements simultaneously with a sampling clock, the outputs of the memory elements being connected to an input of a linear logic element.

Also presented is a circuit assemblage having a random source having at least one digital output signal having a bit width of at least one bit, and a having circuit for compressing said output signal, the circuit performing a blockwise XOR-ing of n bits of each bit of the output signal to yield one respective bit of a compressed output signal, and the sequence of compressed signal values thus constituted being tested in terms of their distribution. The blockwise XOR operation means that n successive bits are respectively serially XORed with one another. The distribution test can be performed for each individual output bit according to FIG. 2 or for the combined output bit according to FIG. 3, for example in such a way that a number of zeros and ones in said bit sequence is counted and these count values are compared with one another. This comparison can be accomplished, for example, by calculating a difference between the two count values, a check being made as to whether the difference exceeds a defined maximum value. The comparison can also be made with fixed bounds.

The circuit assemblage can be notable for the fact that as a function of the result of the distribution test, influence is exerted on the compression factor n.

The random source can furthermore contain at least one ring oscillator that is made up of an annular interconnection of an odd number of inverting elements, said ring oscillator be sampled at at least one position using a clock.

Depending on the result of the distribution test, influence can be exerted on the frequency of the sampling clock.

In addition, as a function of the result of the distribution test, influence can be exerted on the frequency of the ring oscillator, for example by way of the number of inverting elements in the ring oscillator or by modifying the operating conditions of the oscillator (operating voltage, temperature).

The output signal of the random source can be made up of multiple bits, and at least two of said bits are grouped together by a linear operation into one bit that is correspondingly compressed by blockwise XORing of n bits, and the compressed bit sequence is tested in terms of its distribution.

The output signal of the random source can be made up of at least k bits that are not logically combined with one another, and each of these k bits is equipped with a circuit for processing the output signal; the correspondingly compressed k bits form an assignment having $2^k$ possible values, and the occurrence of all these $2^k$ possible values is counted in separate counters, and the frequency of occurrence of all these assignments are mutually compared.

A distribution test may be accomplished, for example, by counting the occurrence of the bit value 0 and the bit value 1 in separate counters for m compressed output bits, and the comparison may be accomplished by calculating the difference between those counter values and comparing the difference to see whether it exceeds a defined bound.

The number of inverting elements in the ring oscillator can be modified as follows:

a) Generic approach for synthesis with a variable number of inverters (can be used only in a FPGA after re-synthesis; fixed in an ASIC).

b) Equip the structure of the ring oscillator with inverters that in part can be bypassed, under the control of a control signal. This additional circuit amplifies the unequal capacitances of the nodes in the ring oscillator. This does not have a disadvantageous effect, however, if the compression factor and/or sampling frequency is/are correspondingly varied in such a way that the out-of-balance condition thereby caused is compensated for.

A modification of the operating conditions of the oscillator can be provided, for example, by:

a) modifying the operating voltage by way of a separately controllable supply voltage, or by way of series resistors in the power supply to the ring oscillator, b) modifying the operating temperature using heating or cooling elements that are selectably switched in.

A mutual comparison means, for example, that the largest and the smallest number of an assignment are identified by a larger/smaller comparison, for example a) by checking whether a difference becomes negative, or b) by sorting the assignment values (bitwise decision beginning from the MSB; at the first deviation at a bit position, the value having a 1 at that location is larger than the other), and then calculating the difference between the largest and smallest value, which is in turn compared with a fixed bound.

What is claimed is:

1. A method for post-processing an output of a random source of a random generator, the random source outputting a digital output signal having a bit width of at least one bit, comprising:

compressing, via a circuit, the output signal; and performing a blockwise linear logical combination of n successive bits of the output signal in a context of the compression, wherein n is a compression factor, with a result that a compressed output signal is generated that encompasses a sequence of compressed signal values, checking, via a checking device, the sequence of compressed signal values by a distribution test in terms of a distribution of the sequence.

2. The method as recited in claim 1, wherein the compression factor n is influenced as a function of the result of the distribution test.

3. The method as recited in claim 1, wherein the random source includes a ring oscillator that encompasses a ring-shaped interconnection of an odd number of inverting elements, the ring oscillator being sampled with a sampling clock at at least one sampling point.

4. The method as recited in claim 3, wherein a frequency of the sampling clock is influenced as a function of the result of the distribution test.

5. The method as recited in claim 3, wherein a frequency of the ring oscillator is influenced as a function of the result of the distribution test.

6. The method as recited in claim 5, wherein a frequency of the ring oscillator is influenced by selecting a number of inverting elements.

7. The method as recited in claim 5, wherein a frequency of the ring oscillator is influenced by modifying operating conditions.

8. The method as recited in claim 1, wherein the output signal of the random source includes a plurality of bits, and wherein at least two of the bits are combined by way of a linear operation into one bit that is correspondingly compressed by blockwise XORing of n successive bits, yielding a compressed bit sequence, and the compressed bit sequence is tested with regard to its distribution.

9. The method as recited in claim 1, wherein the output signal of the random source includes at least k bits, each of said k bits being equipped with a circuit for processing the output signal, the corresponding compressed k bits constituting an assignment having $2^k$ possible values, and an occurrence of all the $2^k$ possible values being counted in separate counters, and a frequency of occurrence of all the assignments are mutually compared.

10. An assemblage for post-processing an output of a random source of a random generator that outputs a digital output signal having a bit width of at least one bit, the assemblage comprising:

a circuit configured to compress the output signal, a blockwise linear logical combination of n successive bits of the output signal being performed in a context of the compression, n being a compression factor, with a result that a compressed output signal is generated which encompasses a sequence of compressed signal values; and a checking device with which the sequence of compressed signal values is checked in terms of a distribution of the sequence.

* * * * *